(12) United States Patent
Wojtczak et al.

(10) Patent No.: US 7,994,062 B2
(45) Date of Patent: Aug. 9, 2011

(54) SELECTIVE SILICON ETCH PROCESS

(75) Inventors: William A. Wojtczak, Austin, TX (US); Sian Collins, Austin, TX (US)

(73) Assignee: Sachem, Inc., Austin, TX (US)

( * ) Notice: Subject to any disclaimer, the term of this patent is extended or adjusted under 35 U.S.C. 154(b) by 132 days.

(21) Appl. No.: 12/609,692

(22) Filed: Oct. 30, 2009

(65) Prior Publication Data

US 2011/0104875 A1    May 5, 2011

(51) Int. Cl.
*H01L 21/311* (2006.01)

(52) U.S. Cl. ........ 438/700; 438/589; 438/745; 438/753; 257/E21.214; 257/E21.219; 257/E21.223

(58) Field of Classification Search ................. 438/214, 438/280; 257/E21.221, E21.385, E21.42, 257/E21.483, E21.485
See application file for complete search history.

(56) References Cited

U.S. PATENT DOCUMENTS

| | | | |
|---|---|---|---|
| 3,738,881 A | 6/1973 | Erdman et al. |
| 4,113,551 A | 9/1978 | Bassous et al. |
| 4,172,005 A | 10/1979 | Muraoka et al. |
| 4,239,661 A | 12/1980 | Muraoka et al. |
| 4,781,853 A | 11/1988 | Lowry et al. |
| 4,929,301 A | 5/1990 | Beechko |
| 4,964,919 A | 10/1990 | Payne |
| 4,996,627 A | 2/1991 | Zias et al. |
| 5,071,510 A | 12/1991 | Findler et al. |
| 5,207,866 A | 5/1993 | Lue et al. |
| 5,259,888 A | 11/1993 | McCoy |
| 5,431,777 A | 7/1995 | Austin et al. |
| 5,498,293 A | 3/1996 | Ilardi et al. |
| 5,565,060 A | 10/1996 | Austin et al. |
| 5,857,885 A | 1/1999 | Laou et al. |
| 5,989,353 A | 11/1999 | Skee et al. |
| 5,997,713 A | 12/1999 | Beetz, Jr. et al. |
| 6,268,285 B1 | 7/2001 | Avanzino et al. |
| 6,403,289 B1 | 6/2002 | Tanaka et al. |
| 6,451,218 B1 | 9/2002 | Holdermann |
| 6,458,343 B1 | 10/2002 | Zeman et al. |
| 6,551,972 B1 | 4/2003 | Lei et al. |
| 6,787,052 B1 | 9/2004 | Vaganov |

(Continued)

FOREIGN PATENT DOCUMENTS

| EP | 0580880 | 2/1994 |
|---|---|---|
| JP | 11084687 | 3/1999 |
| JP | 3027030 B2 | 3/2000 |

OTHER PUBLICATIONS

Crosslight Software Inc.; Quantum Well Model for Strained Mosfet, Aug. 31, 2006.

(Continued)

*Primary Examiner* — Cheung Lee

(74) *Attorney, Agent, or Firm* — Renner, Otto, Boisselle & Sklar

(57) ABSTRACT

A process for etching a silicon layer disposed on a substrate, including anisotropically etching a first trench in the silicon layer; selectively anisotropic wet etching silicon surfaces in the first trench, the wet etching comprising exposing the silicon surfaces to an aqueous composition including an aromatic tri(lower)alkyl quaternary onium hydroxide, and an unsymmetrical tetraalkyl quaternary phosphonium salt; in which the wet etching etches (110) and (100) planes of the silicon layer at about equal rates and preferentially to the (111) plane to form an enlarged trench having a sidewall in the (111) plane. A silicon alloy may be epitaxially deposited in the thus-produced trench as part of a process of introducing stress into at least a portion of the silicon layer.

25 Claims, 3 Drawing Sheets

U.S. PATENT DOCUMENTS

| | | | |
|---|---|---|---|
| 6,861,318 | B2 | 3/2005 | Murthy et al. |
| 6,881,622 | B2 | 4/2005 | Yu et al. |
| 6,912,081 | B2 | 6/2005 | Bolle et al. |
| 6,927,146 | B2 | 8/2005 | Brask et al. |
| 7,012,007 | B1 | 3/2006 | Goo et al. |
| 7,094,696 | B2 | 8/2006 | Geist |
| 7,262,465 | B2 | 8/2007 | Hatada et al. |
| 7,303,999 | B1 | 12/2007 | Sriraman et al. |
| 7,354,863 | B2 | 4/2008 | Kirby et al. |
| 7,407,860 | B2 | 8/2008 | Kim et al. |
| 7,429,775 | B1 | 9/2008 | Nayak et al. |
| 7,435,656 | B2 | 10/2008 | Shima |
| 7,446,394 | B2 | 11/2008 | Fukuda et al. |
| 2002/0042208 | A1 | 4/2002 | Beitel et al. |
| 2003/0073299 | A1 | 4/2003 | Mashino |
| 2004/0256734 | A1 | 12/2004 | Farnworth et al. |
| 2005/0065050 | A1 | 3/2005 | Starzynski |
| 2005/0077913 | A1 | 4/2005 | Watkins et al. |
| 2005/0104228 | A1 | 5/2005 | Rigg et al. |
| 2006/0249797 | A1* | 11/2006 | Nakazawa et al. ............ 257/378 |
| 2006/0255316 | A1 | 11/2006 | Kirby et al. |
| 2006/0289856 | A1 | 12/2006 | Shimamune et al. |
| 2007/0012913 | A1 | 1/2007 | Ohta et al. |
| 2008/0026585 | A1 | 1/2008 | Kim et al. |
| 2008/0054316 | A1 | 3/2008 | Xiang et al. |
| 2008/0268609 | A1 | 10/2008 | Wang et al. |
| 2008/0303062 | A1 | 12/2008 | Mimura et al. |
| 2009/0152634 | A1 | 6/2009 | Grant |

OTHER PUBLICATIONS

G. Taraschi et al; Solid-State Electronics 48 (2004) 1297-1305; Strained Si, SiGe, and Ge on-insulator: review of wafer bonding fabrication techniques.

P.M. Sarro et al; Sensors and Actuators 85 (2000) 340-345; Effect of surfactant on surface quality of silicon microstructures etched in saturated TMAHW solutions.

J. Lee et al; Thin Solid Films 508 (2006) 10-13; Pattern size dependence of Si1-xGex epitaxial growth for high mobility device applications.

H. Ohta et al; Electron Devices Meeting, 2005. IEDM Tech. Digest, IEEE Int'l.; High Performance 30 nm Gate Bulk CMOS for 45 nm Node with Σ-shaped SiGe-SD; Dec. 2005, 4 pp.

Chii-Rong Yang et al; J. Micromech. Microeng. 15 (2005) 2028-2037; Study on anisotropic silicon etching characteristics in various surfactant-added tetramethyl ammonium hydroxide water solutions.

N. Tamura et al; Applied Surface Science 254 (2008) 6067-6071; 45 nm CMOS technology with low temperature selective epitaxy of SiGe.

Y. Bogumilowicz et al; 2005 Semicond. Sci. Technol. 20, 127-134; Chemical vapour etching of Si, SiGe and Ge with HCl; applications to the formation of thin relaxed SiGe buffers and to the revelation of threading dislocations.

Virginia Semiconductor, Inc.; Wet-Chemical Etching and Cleaning of Silicon; Jan. 2003.

M.A. Hines; Annu. Rev. Phys. Chem. 2003. 54:29-56; In Search of Perfection: Understanding the Highly Defect-Selective Chemistry of Anisotropic Etching.

IEDM shows real details of materials technology, devices; http://www.solid-state.com/display_article/316496/5/none/non; pp. 1-4; 2007 Int'l Electron Devices Meeting, Washington, D.C.

* cited by examiner

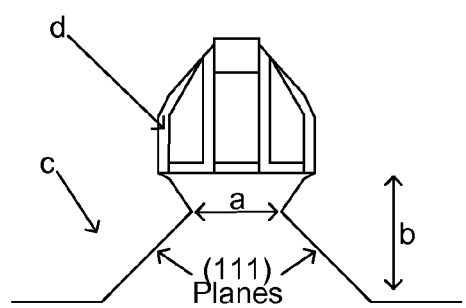
FIG. 3
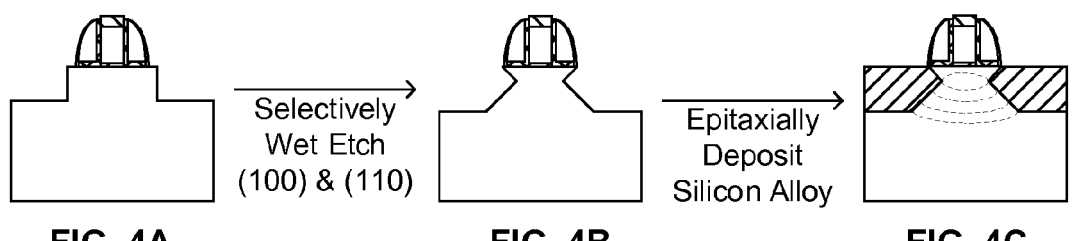
FIG. 4A  →  Selectively Wet Etch (100) & (110)  →  FIG. 4B  →  Epitaxially Deposit Silicon Alloy  →  FIG. 4C

SELECTIVE SILICON ETCH PROCESS

BACKGROUND

1. Technical Field

The present invention relates generally to fabrication of metal oxide semiconductor field effect transistors and other silicon-based devices. More specifically, the present invention relates to processes for selectively etching silicon for use in such and similar devices.

2. Background

Silicon wet etch is an important process in integrated circuit manufacturing. A specific application for selective silicon wet etch is for introduction of strain for gate formation in the Front End of Line (FEOL) process of transistor construction. Gate oxide, silicon oxide, silicon nitride, polysilicon, and other films may be deposited on silicon to form the transistor gate structures through successive deposition, patterning and etching steps. During this process, through selective masking, the silicon surface is doped with boron, phosphorus, arsenic or other negative or positive silicon biasing elements. The silicon surface is then heated to drive the dopants into the silicon. The monocrystalline silicon is then etched to create channels between the gates for subsequent deposition of a strain inducing silicon alloy such as silicon-germanium (SiGe). It has been found that some amount of strain is beneficial in improving mobility of carriers in, e.g., a MOS transistor channel region. While a number of processes have been disclosed for such strain introduction, improvements are needed to more effectively and controllably etch the trenches into which the silicon alloy will be deposited and to more effectively and controllably create in and apply to the channels a desired amount of strain. The amount of strain desired can be difficult to obtain if the strain inducing silicon alloy contains too many dislocations in the crystalline structure, since the dislocations relieve strain and/or do not generate sufficient strain when deposited.

SUMMARY

Stacking faults are planar defects which may occur in epitaxial films when the crystal stacking sequence is disrupted because of local environmental changes during growth, e.g., by surface roughness. The defects are characterized by the fact that the displacement between planes on either side of the defect is not a perfect crystal translation vector for the material in question. For instance, for materials in which the crystal grows in the (111) direction according to the close packing stacking sequence ABCABC, where A, B and C are distinct stacking sites between which the crystal translation vector is (½) [110]. A stacking sequence of ABCAB//ABC contains a fault between planes "B" and "A" indicated by "//" and is termed an intrinsic stacking fault and can be thought of as the removal of a crystal plane ("C" in this case). In contrast, a stacking sequence of ABCA/C/BCABC is termed an extrinsic stacking fault and can be thought of as the insertion of an extra plane into the stacking sequence (in this case "C").

The present inventors have discovered that, by applying a process and composition for selectively etching silicon which results in little or no increase in roughness of the silicon surfaces, relative to an untreated silicon surface, a desired amount of strain can be controllably and effectively obtained in the subsequent deposition of the strain inducing silicon alloy. The present inventors discovered that, since any roughness in a (111) surface contains some (110) surface character, and since strain inducing silicon alloys such as SiGe grow disproportionately faster on the (110) surface relative to the (111) surface, the roughness results in the formation of discontinuities (i.e., stacking faults) in the deposited strain inducing silicon alloy resulting in dislocations in the crystal structure of the deposited strain inducing silicon alloy, and that by use of a process and composition as disclosed herein, the roughness could be reduced. The dislocations or stacking faults result in reduced strain and thus a failure to obtain the desired amount of strain in the sought strain inducing deposit. The present inventors discovered that by selecting a composition as described herein for use in etching the silicon, increases in roughness could be avoided, a smoother surface could be obtained, and the amount of strain induced by the strain inducing silicon alloy could be better controlled.

In accordance with one embodiment of the present invention, a process and a composition for selectively etching silicon are provided. In the etching process, the silicon is selectively etched in the (110) and (100) planes, relative to the (111) plane, and a very smooth surface is obtained. In accordance with the invention, the (110) and (100) planes are etched at approximately the same rate relative to each other, but these planes are preferentially etched relative to the (111) plane, which is etched at a significantly lower rate. The enhanced, but controlled and not excessive selectivity provides an improved silicon surface for subsequent epitaxial deposition of a strain inducing silicon alloy such as silicon germanium or silicon carbon. The improved silicon surface resulting from the processes in accordance with embodiments of the present invention provides for enhanced strain introduction, and a smoother, more regular surface in the trenches into which the strain-producing silicon alloy is to be epitaxially deposited. As noted above, it is more difficult to effectively epitaxially deposit the strain inducing silicon alloy onto a too-rough silicon surface. Therefore, the smooth, regular surfaces obtained by the present invention enhance the ability in subsequent steps to epitaxially deposit the silicon alloy, which is important to obtaining a desired amount of strain.

The process of the present invention, in one embodiment, employs a composition comprising a quaternary onium hydroxide and an unsymmetrical quaternary phosphonium salt. In one embodiment, the composition further comprises a glycol ether.

Thus, in one embodiment, the present invention provides a process for etching a silicon layer disposed on a substrate, including:
 anisotropically etching a first trench in the silicon layer;
 selectively anisotropic wet etching silicon surfaces in the first trench, the wet etching comprising exposing the silicon surfaces to an aqueous composition comprising:
  an aromatic tri(lower)alkyl quaternary onium hydroxide, and
  an unsymmetrical tetraalkyl quaternary phosphonium salt;
 wherein the wet etching etches the (110) and (100) planes of the silicon layer at about equal rates and preferentially to the (111) plane to form an enlarged trench having a sidewall in the (111) plane. The wet etching is a selectively anisotropic etch, in that while it preferentially etches the (110) and (100) planes of the silicon layer relative to the (111) plane by a factor in the range from about 1.4:1 to about 2.3:1, or in one embodiment, by a factor of about 2:1, it shows little selectivity for the (110) plane over the (100) plane. These selectivity ratios are in sharp contrast to typical quaternary ammonium hydroxide etches that show strong orientational preference for (100)/(111) of, e.g., 35:1 and (110)/(100) etch rates of 2:1 or more for simple tetramethylammonium hydroxide etches. So, while the present invention is an anisotropic wet etch, it differs from previously used alkaline anisotropic etches in that it is a selectively anisotropic wet etch. The selectivity of the anisotropic etch of the present invention is controllable and provides an unprecedented degree of control on the relative etch rates for the respective silicon planes and results in significantly smoother etched surfaces. The improved smoothness is important to subsequently deposited strain inducing silicon alloy.

In one embodiment, the process in accordance with the present invention provides etched surfaces which are very smooth and defect free. Thus, in one embodiment, the enlarged trench includes exposed silicon surfaces having a roughness $R_a$ in the range from about 0.340 nm to about 0.450 nm, when measured by atomic force microscopy (AFM). In one embodiment, the enlarged trench includes exposed silicon surfaces having a roughness $R_{rms}$ in the range from about 0.430 nm to about 0.550 nm, when measured by atomic force microscopy (AFM). In one embodiment, the enlarged trench includes exposed silicon surfaces having a roughness $R_{max}$ in the range from about 4.9 nm to about 6 nm, when measured by AFM.

AFM measurements on the reentrant surfaces of the trench are not possible to make on the intact trench. Roughness measurements reported here represent roughness of (100) oriented surfaces that correspond to the trench bottom. When created with the etching solutions of the present invention, roughness of the (111) plane oriented sidewalls is expected to be lower than that of the measured (100) surface since the crystalline orientation of rough features on the (111) surface will have crystal plane orientations other than (111) and are more easily etched than the underlying planes.

In one embodiment, the enlarged trench obtained in accordance with the present invention includes exposed silicon surfaces having a $R_{rms}$ roughness, measured by AFM, that is not significantly increased from the roughness of a similar, untreated, silicon surface. Thus, in one such embodiment, the silicon surface, post-etching has a $R_{rms}$ roughness, measured by AFM, within about 6% greater than that of a similar, untreated crystalline silicon surface. In another embodiment, the silicon surface, post-etching has a $R_{rms}$ roughness, measured by AFM, within about 10% greater than that of a similar, untreated crystalline silicon surface. In another embodiment, the silicon surface, post-etching has a $R_{rms}$ roughness, measured by AFM, within about 25% greater than that of a similar, untreated crystalline silicon surface. In another embodiment, the silicon surface, post-etching has a $R_{rms}$ roughness, measured by AFM, within about 90% greater than that of a similar, untreated crystalline silicon surface.

In one embodiment, the enlarged trench obtained in accordance with the present invention includes sidewalls and other exposed silicon surfaces having a roughness such that, when a strain inducing silicon alloy is deposited in the trench, the deposit contains a number of stacking faults or dislocations that is within about one order of magnitude of the number of stacking faults or dislocations that would be obtained by depositing the same strain inducing silicon alloy on a similar, untreated crystalline silicon surface. That is, for example, if a strain inducing SiGe alloy is deposited on an untreated crystalline silicon surface would result in about $10^8$ dislocations per square centimeter ($10^8/cm^2$), in one embodiment, the number of dislocations in a strain inducing SiGe alloy deposited on a surface etched in accordance with the present invention would be no more than about $10^7$ dislocations per square centimeter ($10^7/cm^2$). It is recognized that the actual number of dislocations/$cm^2$ may vary widely, depending on many factors, such as the ratio of Si to the alloying element, the conditions of deposition, any subsequent annealing, and other factors known to the skilled artisan. However, this feature may be readily determined by comparing strain inducing silicon alloys deposited under substantially identical conditions on the two different substrates, i.e., untreated and etched in accordance with the present invention.

In another embodiment, the present invention provides a process for etching a silicon layer disposed on a substrate, the silicon layer having thereon a plurality of structures, such as spacer features or gate structures, disposed to create openings exposing the silicon layer, including:

through the openings, anisotropically etching a first trench in the silicon layer;

selectively anisotropic wet etching silicon surfaces in the first trench, the wet etching comprising exposing the silicon surfaces to an aqueous composition comprising:

an aromatic tri(lower)alkyl quaternary onium hydroxide, and an unsymmetrical tetraalkyl quaternary phosphonium salt;

wherein the wet etching etches (110) and (100) planes of the silicon layer at about equal rates and preferentially to the (111) plane to form an enlarged trench having sidewalls in the (111) plane.

In another embodiment, the present invention provides a process for introducing stress into a silicon layer, including the foregoing steps of etching a first trench and selectively anisotropic wet etching to form an enlarged trench, and further including epitaxially depositing a silicon alloy into at least a portion of the enlarged trench.

In one embodiment, the present invention enables the formation of improved silicon layers containing desirable strain characteristics in selected locations. The composition of the present invention enables the silicon layer to be etched in such a way to provide a smooth, level surface, upon which the subsequently deposited silicon alloy layer or fill can be reliably deposited epitaxially. That is, due to this smooth regular silicon surface obtained by the process in accordance with the present invention, the subsequently deposited silicon alloy is able to be deposited such a way that the atoms are aligned to result in an epitaxial deposit of the silicon alloy. In one embodiment, the silicon alloy may be silicon-germanium, and in another embodiment, the silicon alloy may be silicon-carbon.

Although other processes have been used for etching silicon with the goal of obtaining a smooth surface in the silicon remaining after the etching, these processes have required the application of additional smoothing steps following the primary etch step. The present invention provides a method which directly obtains a desirably smooth surface in the selectively anisotropic wet etching step, and therefore does not need to include subsequent smoothing steps. This represents a significant improvement, since any process which requires fewer steps is desirable and has been sought for use in the semiconductor fabrication process. Thus, the present invention addresses and provides a solution to the problem of obtaining a controllable amount of strain in gate formation in the Front End of Line (FEOL) process of transistor construction.

BRIEF DESCRIPTION OF THE DRAWINGS

FIG. 3 is a schematic cross-sectional view of a nascent transistor illustrating important aspects of embodiments of the present invention.

FIGS. 4A, 4B and 4C are schematic cross-sectional views depicting the deposition of a silicon alloy and the stress resulting in the channel of the transistor as a result of the presence of the silicon alloy.

Figure 1:
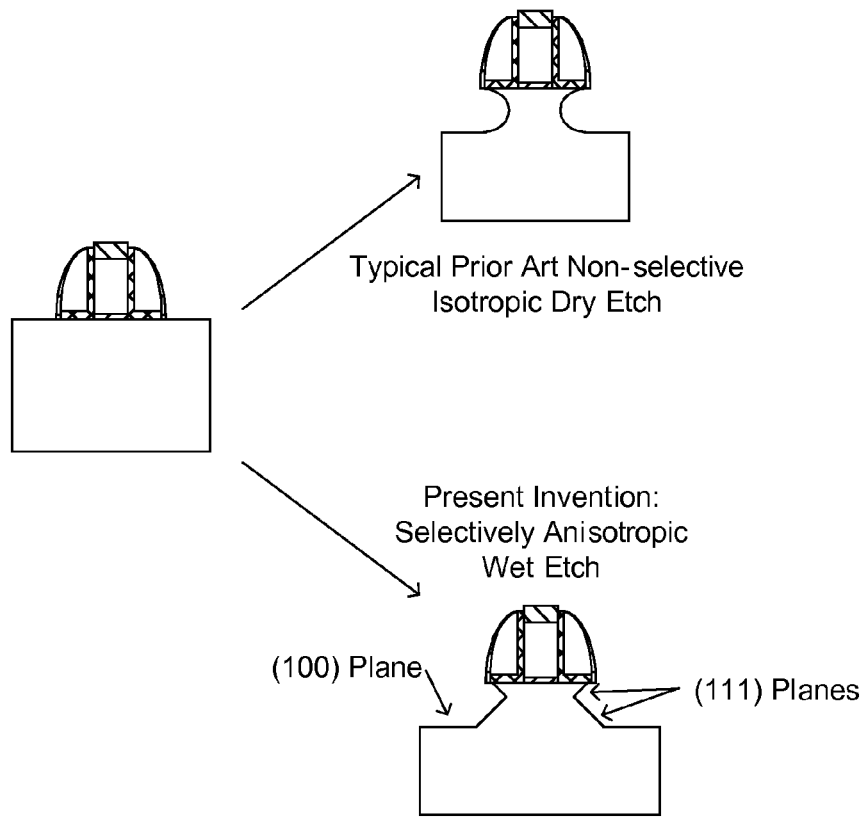
FIG. 1 is a schematic cross-sectional view of a portion of a nascent semiconductor device comparing a prior art etch process with an etch process in accordance with an embodiment of the present invention.

It should be appreciated that for simplicity and clarity of illustration, elements shown in the Figures have not necessarily been drawn to scale. For example, the dimensions of some of the elements are exaggerated relative to each other for clarity. Further, where considered appropriate, reference numerals have been repeated among the Figures to indicate corresponding elements.

It should be appreciated that the process steps and structures described herein do not form a complete system or process flow for carrying out a silicon etching or silicon etching and strain introduction process, such as would be used in manufacturing a semiconductor device or other device. The present invention can be practiced in conjunction with fabrication techniques and apparatus currently used in the art, and only so much of the commonly practiced materials, apparatus and process steps are included as are necessary for an understanding of the present invention.

Throughout the disclosure and claims, the numerical limits of the disclosed ranges and ratios may be combined, and all intervening values are deemed to be disclosed by the disclosure of the ranges. Throughout the disclosure and claims, any member of a group may be deleted from the group. Throughout the disclosure and claims, all possible combinations of the various disclosed elements may be combined, and all such combinations are deemed to be included within the scope of the present invention. Unless otherwise specified all temperatures are measured in degrees Celsius, all processes are conducted at room or ambient temperature, all pressures are atmospheric.

DETAILED DESCRIPTION

Throughout the specification and claims, the range and ratio limits may be combined. It is to be understood that unless specifically stated otherwise, reference to "a", "an", and/or "the" may include one or more than one, and that reference to an item in the singular may also include the item in the plural. All combinations specified in the specification and claims may be combined in any manner, and any one or more individual element of a group of elements may be omitted from or restricted out of the group.

Certain of the embodiments of the invention briefly described in the foregoing Summary are described in more detail in the following written description so as to enable a person of skill in the art to make and use the invention.

As used herein, a silicon alloy is an alloy formed by epitaxially co-deposited silicon and another atom having similar atomic characteristics, such as germanium or carbon, or a combination of germanium and carbon. In the silicon alloy, the alloying atoms, e.g., germanium or carbon or both, replace some number of silicon atoms in a silicon deposit. In accordance with an embodiment of the invention, the silicon alloy deposit is a crystalline deposit obtained by epitaxially depositing the silicon alloy onto a single crystal silicon substrate or the surface of a single crystal silicon substrate. As will be understood, the silicon substrate may have been doped at some point prior to the epitaxial deposition of the silicon alloy.

As used herein, an aromatic tri(lower)alkyl quaternary onium hydroxide is a quaternary ammonium or phosphonium hydroxide containing one substituent which is aromatic, e.g., phenyl, naphthyl or benzyl, in which the respective phenyl, naphthyl or benzyl group may be further substituted with one or more of a halogen, a nitro group, a lower alkyl group, a hydroxyl group, a cyano group, a lower alkoxy group, an acyl group, and in which the three lower alkyl or alkoxy groups are or contain independently a $C_1$-$C_4$ alkyl group.

As used herein, an unsymmetrical tetraalkyl quaternary phosphonium salt is a quaternary phosphonium salt in which three of the alkyl groups are lower alkyl groups which are independently a $C_1$-$C_4$ alkyl group, and the fourth alkyl group is a branched or unbranched alkyl group containing from about 8 to about 22 carbon atoms, and in which the salt includes an anion that may be or include one or more of halide, sulfate, phosphate, sulfonate, formate, acetate, nitrate, carbonate, or bicarbonate.

In accordance with one embodiment of the present invention, a process for etching a silicon layer disposed on a substrate is provided. In one embodiment, the silicon layer may have thereon a plurality of structures, such as spacer features and/or gate structures, disposed so as to create openings exposing the silicon layer. The process includes at least the following steps:

anisotropically etching a first trench in the silicon layer;

selectively anisotropic wet etching silicon surfaces in the first trench, the wet etching comprising exposing the silicon surfaces to an aqueous composition comprising:

an aromatic tri(lower)alkyl quaternary onium hydroxide, and an unsymmetrical tetraalkyl quaternary phosphonium salt;

wherein the wet etching etches (110) and (100) planes of the silicon layer at about equal rates and preferentially to the (111) plane to form an enlarged trench having sidewalls in the (111) plane.

As used herein, the "about equal rates" means that the ratio of (100)/(110) etch rates ranges from about 0.8:1 to about 1.2:1, and in one embodiment, from about 0.8:1 to about 1:1, and in another embodiment, from about 0.9:1 to about 1.1:1, and in another embodiment, from about 0.9:1 to about 1:1. As noted above, this "about equal rates" of the (100)/(110) etch ratio in accordance with the present invention contrasts with the quite unequal ratio of the (100)/(110) etches from about 0.5:1 down to 0.1:1 or lower obtained by conventional etching compositions and processes. In obtaining the about equal rates of the (100)/(110) etches, coupled with the preferential etching of these planes relative to the (111) plane, the present invention provides a selectively controllable anisotropic etch which allows formation of a trench having sidewalls in the (111) plane in which the sidewalls are quite smooth compared to an unprocessed (100) silicon surface.

Where the surface includes the structures and openings, the silicon etching steps are generally conducted by accessing the silicon through or by way of the openings. The structures may simply be a patterned masking layer or nascent or actual active device elements, such as a gate structure, in which the sidewall spacers of the gate structure, or coatings applied thereto, constitute the structures around which openings to the underlying silicon layer are created. Alternatively, there may be a combination of such active structures and a patterned masking layer, as needed to provide an opening at a suitably selected location and of a suitable size.

In one embodiment, the silicon layer has thereon a plurality of structures disposed to create openings exposing the silicon layer, and the selectively anisotropic etching is carried out through the openings.

In one embodiment, the selectively anisotropic wet etching partially undercuts each of the plurality of structures and the enlarged trench comprises two sidewalls in the (111) plane. This is shown and described in more detail in the descriptions of the drawings.

In one embodiment, the aromatic tri(lower)alkyl quaternary onium hydroxide comprises an ammonium or a phosphonium or a combination of any two or more thereof. In one embodiment, in the aromatic tri(lower)alkyl quaternary onium hydroxide, each of the (lower)alkyl groups independently contain from 1 to about 4 carbon atoms. In one embodiment, in the aromatic tri(lower)alkyl quaternary onium hydroxide, the aromatic group is a benzyl or a phenyl group, and each lower alkyl is independently methyl or ethyl. These compounds are described in more detail in the following description of onium compounds.

In one embodiment, the unsymmetrical tetraalkyl quaternary phosphonium salt comprises an alkyl group having from about eight to about 18 carbon atoms and further comprises one or more lower alkyl groups independently containing from 1 to about 4 carbon atoms. These compounds are described in more detail in the following description of onium compounds.

In one embodiment, the aqueous composition further comprises a glycol ether. In one embodiment, the glycol ether is a mono alkyl ether. In one embodiment, the glycol ether is dipropyleneglycol monomethyl ether. In one embodiment, the glycol ether is present at a concentration up to about 5 wt. %

Organic Onium Compounds

Useful organic onium compounds for the present invention include organic onium salts and organic onium hydroxides such as quaternary ammonium hydroxides and quaternary phosphonium hydroxides.

In one embodiment, the onium hydroxides may generally be characterized by the formula (I):

$$A(OH)_x \quad (I)$$

wherein in (I), A is an aromatic-containing onium group and x is an integer equal to the valence of A. Most often A is an onium ion having a single positive charge, i.e., a valence of +1, but onium ions having multiple positive charges, e.g., 2 to 4 positive charges, are within the scope of the definition of A in the present invention. Examples of onium groups include ammonium groups and phosphonium groups. The onium hydroxide should be sufficiently soluble in a solution such as water, alcohol or other organic liquid, or mixtures thereof to permit a useful wet etch rate.

In one embodiment, the quaternary onium hydroxide are characterized by the formula (II):

(II)

wherein in formula (II), A is a nitrogen or phosphorus atom, $R^1$ is an aromatic-containing group, and $R^2$, $R^3$ and $R^4$ are each independently lower alkyl, alkoxy or hydroxyalkyl groups. In one embodiment, the lower alkyl groups independently contain from 1 to about 4 carbon atoms, the hydroxyalkyl groups contain from 1 to about 4 carbon atoms and the alkoxyalkyl groups contain from 2 to about 5 carbon atoms.

In formula (II), the aromatic-containing group may be an aryl group or a hydroxyaryl group. Examples of suitable aryl and hydroxyaryl groups include phenyl, benzyl, 1-naphthyl, 2-naphthyl, phenanthryl, and lower alkyl-substituted analogs, e.g., tolyl or xylyl, in which the lower alkyl group ranges from 1 to about 4 carbon atoms, and the corresponding hydroxy-aryl groups wherein the aromatic rings, including the lower alkyl-substituted analogs, have been substituted with one or more hydroxy groups.

In formula (II), the groups $R^2$ to $R^4$ independently may be linear or branched, and specific examples of such lower alkyl groups include methyl, ethyl, propyl and butyl groups. One or more of the groups $R^2$ to $R^4$ also independently may be a hydroxyalkyl group containing from 1 to 4 carbon atoms such as hydroxyethyl and the various isomers of hydroxypropyl, hydroxybutyl, etc. One or more of the groups $R^2$ to $R^4$ also independently may be an alkoxyalkyl group containing from 2 to 5 carbon atoms such as methoxymethyl, ethoxyethyl and the various isomers of alkoxypropyl, alkoxybutyl, etc. It is specifically contemplated that any combination of the foregoing alkyl, hydroxyalkyl and alkoxyalkyl groups may be used.

In one embodiment, the quaternary ammonium hydroxide which can be used in accordance with the process of the present invention may include, for example, phenyltrimethylammonium hydroxide, phenyltriethylammonium hydroxide, benzyltrimethylammonium hydroxide, and benzyltriethylammonium hydroxide, or mixtures of any of these.

In one embodiment, the unsymmetrical quaternary phosphonium salts which can be employed in accordance with the present invention are characterized by the formula (III):

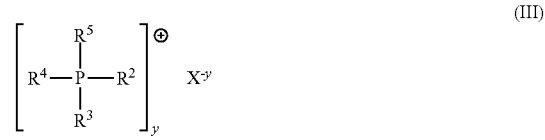

(III)

wherein in formula (III), $R^5$ is a branched or unbranched alkyl group containing from about 8 to about 22 carbon atoms, and $R^2$, $R^3$ and $R^4$ are as defined in Formula (II), $X^-$ is an anion of an acid, and y is a number equal to the valence of X. Examples of anions of acids include bicarbonates, halides, nitrates, formates, acetates, sulfates, carbonates, phosphates, etc. In one embodiment, $R^5$ is a $C_{10}$-$C_{22}$ alkyl group, and in one embodiment $R^5$ is a $C_{14}$-$C_{18}$ alkyl group.

Examples of quaternary phosphonium salts representative of formula (III) which can be employed in accordance with the present invention include tetradecyltributylphosphonium chloride, hexadecyltrimethylphosphonium chloride, tetradecyltriethylphosphonium chloride, hexadecyltriethylphosphonium chloride, dodecyltributylphosphonium chloride, dodecyltrimethylphosphonium chloride, octadecyltributylphosphonium chloride, octadecyltrimethylphosphonium chloride, etc., and the corresponding anions, including, e.g., fluorides, bromides, iodides, sulfates, carbonates, and phosphates. In one embodiment, fluorides are not used, since fluoride may result in undesirable etching of silicon.

In one embodiment, larger onium cations, including those with larger organic groups, provide more compatibility with photoresist materials. In one embodiment, larger phosphonium ions provide smoother etched surfaces, as compared to a phosphonium ion lacking the long-chain alkyl group.

The foregoing onium hydroxides and phosphonium salts are commercially available, for example, from SACHEM, Inc., Austin, Tex. Additionally, onium hydroxides can be prepared from the corresponding onium salts such as the corresponding onium halides, carbonates, formates, sulfates and the like. Various methods of preparation are described in U.S. Pat. No. 4,917,781 (Sharifian et al) and U.S. Pat. No. 5,286,354 (Bard et al) which are hereby incorporated by reference. There is no particular limit as to how the onium hydroxide or salt is obtained or prepared. In one embodiment, the metal content of the onium hydroxides and salts should be as low as possible, and should be within specifications and suitable for use in semiconductor device processing.

The concentration of the aromatic tri(lower)alkyl onium hydroxide in the compositions of the present invention may range from 0.1 wt % to about 20 wt % of the wet etching composition. Appropriate dilutions can be determined by those of skill in the art, based on the concentration supplied and the concentration desired to be employed in the wet etching composition. In one embodiment, the aromatic tri(lower)alkyl onium hydroxide concentration is in a range from about 0.5 wt % to about 15 wt %, and in another embodiment, the aromatic tri(lower)alkyl onium hydroxide concentration is in a range from about 2 wt % to about 10 wt %, and in another embodiment, the aromatic tri(lower)alkyl onium hydroxide concentration is in a range from about 3 wt % to about 8 wt %, and in one embodiment, the aromatic tri(lower)alkyl onium hydroxide concentration is about 4 wt %, all concentrations based on the total weight of the wet etching solution.

The concentration of the unsymmetrical phosphonium salt in the compositions of the present invention may range from 0.1 wt % to about 20 wt % of the wet etching composition. Appropriate dilutions can be determined by those of skill in the art, based on the concentration supplied and the concentration desired to be employed in the wet etching composition. In one embodiment, the unsymmetrical phosphonium salt concentration is in a range from about 0.5 wt % to about 15 wt %, and in another embodiment, the unsymmetrical phosphonium salt concentration is in a range from about 2 wt % to about 10 wt %, and in another embodiment, the unsymmetrical phosphonium salt concentration is in a range from about 3 wt % to about 8 wt %, and in one embodiment, the unsymmetrical phosphonium salt concentration is about 4 wt %, all concentrations based on the total weight of the wet etching composition.

In one embodiment, the wet etching composition contains from about 0.1 to about 20 wt % of the aromatic tri(lower)alkyl onium hydroxide and from about 0.1 to about 20 wt % of the unsymmetrical phosphonium salt, and optionally further includes a glycol, an alcohol, a glycol ether or a combination of any two or more thereof. In one embodiment, the wet etching composition contains from about 0.5 to about 15 wt % of the aromatic tri(lower)alkyl onium hydroxide and from about 0.1 to about 20 wt % of the unsymmetrical phosphonium salt, and optionally further includes a glycol, an alcohol, a glycol ether or a combination of any two or more thereof. In one embodiment, the wet etching composition contains from about 2 to about 10 wt % of the aromatic tri(lower)alkyl onium hydroxide and from about 0.1 to about 20 wt % of the unsymmetrical phosphonium salt, and optionally further includes a glycol, an alcohol, a glycol ether or a combination of any two or more thereof. In one embodiment, the wet etching composition contains from about 3 to about 8 wt % of the aromatic tri(lower)alkyl onium hydroxide and from about 0.1 to about 20 wt % of the unsymmetrical phosphonium salt, and optionally further includes a glycol, an alcohol, a glycol ether or a combination of any two or more thereof. In one embodiment, the wet etching composition contains from about 0.1 to about 20 wt % of the aromatic tri(lower)alkyl onium hydroxide and from about 0.5 to about 15 wt % of the unsymmetrical phosphonium salt, and optionally further includes a glycol, an alcohol, a glycol ether or a combination of any two or more thereof. In one embodiment, the wet etching composition contains from about 0.1 to about 20 wt % of the aromatic tri(lower)alkyl onium hydroxide and from about 2 to about 10 wt % of the unsymmetrical phosphonium salt, and optionally further includes a glycol, an alcohol, a glycol ether or a combination of any two or more thereof. In one embodiment, the wet etching composition contains from about 0.1 to about 20 wt % of the aromatic tri(lower)alkyl onium hydroxide and from about 3 to about 8 wt % of the unsymmetrical phosphonium salt, and optionally further includes a glycol, an alcohol, a glycol ether or a combination of any two or more thereof. In one embodiment, the wet etching composition contains about 3 wt % of the aromatic tri(lower)alkyl onium hydroxide and about 1.5 wt % of the unsymmetrical phosphonium salt, and optionally further includes a glycol, an alcohol, a glycol ether or a combination of any two or more thereof. In one embodiment, the wet etching composition contains about 9 wt % of the aromatic tri(lower)alkyl onium hydroxide and about 1.5 wt % of the unsymmetrical phosphonium salt, and optionally further includes a glycol, an alcohol, a glycol ether or a combination of any two or more thereof. In each of the foregoing, when present the glycol, alcohol, glycol ether or combination of any two or more thereof may be present in an amount up to about 5 wt % of the wet etching composition.

In all of the foregoing, the concentrations of onium compounds are independently determined within the disclosed ranges, and there may be mixtures of any two or more of the hydroxides and/or salts used in any given etchant composition, and the etching composition optionally further includes a glycol, an alcohol, a glycol ether or a combination of any two or more thereof.

Stress Introduction

In one embodiment, the present invention relates to a process for introducing stress into a silicon layer. As discussed in the background, the introduction of stress into a silicon layer has been used for enhancing mobility of electrons and holes in semiconductor materials and particularly in the channel region of MOS transistors. The composition of the present invention, when used in the process described above, is particularly useful for forming cavities into which silicon alloys can be deposited to create stress-producing structures. In accordance with this embodiment, the process for introducing stress include at least the following steps:

providing a silicon layer disposed on a substrate, the silicon layer having a plurality of spacer features disposed thereon so as to create openings to the silicon layer;

through the openings anisotropically etching a first trench in the silicon layer;

selectively anisotropic wet etching silicon surfaces in the first trench, the wet etching comprising exposing the silicon surfaces to an aqueous composition comprising:

an aromatic tri(lower)alkyl quaternary onium hydroxide, and an unsymmetrical tetraalkyl quaternary phosphonium salt;

wherein the wet etching etches the (110) and (100) planes of the silicon layer at about equal rates and preferentially to the (111) plane to form an enlarged trench having sidewalls in the (111) plane; and epitaxially depositing a silicon alloy onto a silicon surface in at least a portion of the enlarged trench.

In one embodiment, the silicon alloy introduces stress into the silicon layer.

In one embodiment, the silicon alloy comprises silicon-germanium.

In one embodiment, the silicon alloy comprises silicon-carbon.

The silicon alloy is epitaxially formed on the surfaces of the enlarged trench. In one embodiment, the silicon alloy includes silicon and germanium. In another embodiment, the silicon alloy includes silicon, germanium and boron, with the boron added as a dopant. The films can be formed in, e.g., a 200 mm chemical vapor deposition chamber with the following processing conditions: dichlorosilane of 20 sccm and germane of 50 sccm, at a temperature of 740° C. In an embodiment in which boron is included, to these flows and temperature can be added diborane of 70 sccm at 1% concentration, to provide the boron as dopant.

As will be understood, the silicon and the germanium form an alloy having a lattice which has the same structure as the structure of the lattice of the silicon of the surfaces of the enlarged trench. The lattice of the alloy of silicon and germanium, however, has a larger spacing than the spacing of the lattice of the silicon of the enlarged trench. Because the lattice of the silicon alloy has the same structure as the silicon of the enlarged trench, the silicon alloy forms epitaxially on the silicon surfaces of the enlarged trench. However, because of the larger spacing of the lattice of the silicon alloy, the silicon alloy creates a compressive stress in the channel adjacent to the enlarged trench. In one embodiment, the germanium is present in the combination of the silicon and the germanium in about 15 atomic percent. It has been found that epitaxy can be maintained with a germanium concentration of up to 20 atomic percent of the combination of the silicon and germanium by volume. This embodiment enhances mobility of holes in the channel.

In an embodiment in which boron is present, the boron concentration may be approximately $0.5 \times 10^{20}/cm^3$ to about $3 \times 10^{20}/cm^3$. The resulting silicon-germanium deposit is thus doped P+.

As will be understood, when the silicon alloy is silicon carbon, similar conditions can be used to epitaxially deposit the silicon alloy, but instead of forming a slightly larger lattice, the silicon carbon alloy forms a slightly smaller lattice, and instead of a compressive stress being applied to the channel region, a tensile stress is applied to the channel region. This embodiment enhances mobility of electrons in the channel. Also, as will be understood, the silicon carbon alloy can also be doped as appropriate.

Exemplary Process

The following is an exemplary process for carrying out an embodiment of the present invention, and is provided for exemplary, non-limiting purposes, to evaluate etching rates of the (100), (110) and (111) silicon planes.

The etching experiments are performed using (100)-oriented, p-doped 4 inch silicon wafers. A masking layer of thermal oxide of 1.2-1.5 µm is grown in a furnace and used for passivation; a simple pattern of circles with diameters from about 1 mm to about 3 mm is formed in the thermal oxide layer using basic photolithography. The silicon wafers are cleaved into pieces and submerged into plastic beakers containing 100:1 HF for 2 minutes to remove surface oxide from the silicon of the circles (but not to remove the passivation oxide), rinsed with DI Water and dried. The chips are then processed by dipping into the etchant solutions at the temperatures shown, ranging from 55° C. to 90° C., while the silicon etching compositions are stirred. The wafer pieces are processed for periods from 5 minutes to 30 minutes after which they are rinsed with DI water and blown dry with nitrogen. The wafers are then examined by profilometry, AFM or SEM.

Process Temperatures

The bath or solution temperature for carrying out a process of selectively anisotropic wet etching a silicon layer in accordance with an embodiment of the present invention may be suitably selected based on factors known to those of skill in the art, including the identity of the specific silicon composition of the silicon layer to be etched, the thickness of the silicon layer to be etched, concentrations of ammonium and/or phosphonium hydroxide and/or salt, the time allotted for the etching, and similar factors known to affect etch rates in silicon etching processes. In one embodiment, the bath or solution temperature of the wet etching composition for selectively anisotropic wet etching the silicon layer ranges from about 30° C. to about 90° C., and in another embodiment, the bath or solution temperature ranges from about 50° C. to about 80° C., and in another embodiment the bath or solution temperature ranges from about 60° C. to about 75° C., and in yet another embodiment, the bath or solution temperature is about 70° C.

Etch Selectivity

In one embodiment, the selectivity obtained by using the wet etching composition in accordance with the present invention as described in the process herein, for the (100) planes relative to the (111) planes, ranges from about 1.4 to about 2.5, and for the (110) planes relative to the (111) planes, ranges from about 1.5 to about 2.5.

In one embodiment, the relative etch rates for the (100) and (110) planes are substantially similar rates, e.g., about equal rates (as defined above), and in one embodiment the etch rate ratio for (100)/(110) and for (110)/(100) are both within the range from about 0.8 to about 1.2.

The data in the following table represents results which may be obtained with processes in accordance with embodiments of the present invention, as illustrated using two different compositions, the first at various temperature conditions, and the second with added glycol ether. As illustrated in the table, the process obtains higher etch rates for the (100) and (110) planes than for the (111) plane.

| Formula | Temp ° C. | Etch Rates (Å/min) | | | Etch Ratios | | |
| --- | --- | --- | --- | --- | --- | --- | --- |
| | | (100) | (110) | (111) | (100)/(111) | (110)/(111) | (100)/(110) |
| 3% BzTMAH 1.5% TDTBPCl | 55 | 111 | 139 | 63 | 1.76 | 2.21 | 0.80 |
| 3% BzTMAH 1.5% TDTBPCl | 70 | 270 | 293 | 195 | 1.38 | 1.50 | 0.92 |

-continued

| | | Etch Rates (Å/min) | | | Etch Ratios | | |
|---|---|---|---|---|---|---|---|
| Formula | Temp °C. | (100) | (110) | (111) | (100)/(111) | (110)/(111) | (100)/(110) |
| 3% BzTMAH 1.5% TDTBPCl | 90 | 965 | 982 | 438 | 2.20 | 2.24 | 0.98 |
| 9% BzTMAH 1.5% TDTBPCl 1% DPGMBE | 55 | 173 | 184 | 80 | 2.16 | 2.30 | 0.94 |

BzTMAH = Benzyltrimethyl ammonium hydroxide
TDTBPCl = Tetradecyltributyl phosphonium chloride
DPGMBE = Dipropylene glycol monobutyl ether The foregoing etch rates for the inventive etchants are determined by profilometry or SEM. The following comparative data is for simple quaternary onium hydroxides not in accordance with the present invention.

| | | Etch Rates (Å/min) | | | Etch Ratios | | |
|---|---|---|---|---|---|---|---|
| Formula | Temp °C. | (100) | (110) | (111) | (100)/(111) | (110)/(111) | (100)/(110) |
| 32 wt % TBAH | 70 | 576 | 1470 | 382 | 1.51 | 3.85 | 0.39 |
| 34.5 wt % TBPH | 70 | 512 | 775 | 296 | 1.73 | 2.62 | 0.66 |

TBAH = tetrabutyl ammonium hydroxide
TBPH = tetrabutyl phosphonium hydroxide

The foregoing etch rates for the prior art etchants are determined from weight loss by applying the etchants to (100), (110) and (111) unprocessed silicon surfaces.

As is apparent from the above data, compositions in accordance with embodiments of the present invention obtain silicon etch rates that are substantially lower than the silicon etch rates obtained by conventional silicon etchants, such as shown in the comparative data. This reduced silicon etch rate is not only mitigated, but is a benefit, in that the selectivity is significantly improved, as also shown by the foregoing data. For the comparative data, the silicon etch rates are much higher, but the selectivity is (110)>>(100)>(111) (where >> indicates much higher etch rate and > indicates a higher etch rate), as compared to the present invention, in which the selectivity is [(110)≈(100)]>(111) (where ≈ indicates substantially similar, e.g., about equal, etch rates as defined above). Thus, in accordance with embodiments of the present invention, the silicon etch rate can be used to reliably etch both the (110) and (100) planes at rates that are substantially similar to each other, and in which both etch rates are significantly greater than etch rate in the (111) plane, thus preferentially leaving more silicon in the (111) plane. In addition to this benefit, the reduced overall etch rates result in much smoother silicon surfaces following the etching, particularly in the (111) plane, most likely due to the lower etch rate in the (111) plane.

Roughness of Etched Silicon Surfaces

As described above, it is important for the surfaces etched by the process of the present invention to be as smooth as possible, to enhance the epitaxial deposition of the silicon alloy onto these surfaces.

In one embodiment, the enlarged trench includes exposed silicon surfaces having a roughness $R_a$ in the range from about 0.34 nm to about 0.45 nm, when measured by atomic force microscopy (AFM). In one embodiment, the enlarged trench includes exposed silicon surfaces having a roughness $R_a$ in the range from about 0.35 nm to about 0.43 nm, when measured by AFM. In one embodiment, the enlarged trench includes exposed silicon surfaces having a roughness $R_a$ in the range from about 0.35 nm to about 0.36 nm, when measured by AFM.

In one embodiment, the enlarged trench includes exposed silicon surfaces having a roughness $R_{rms}$ in the range from about 0.43 nm to about 0.55 nm, when measured by AFM. In one embodiment, the enlarged trench includes exposed silicon surfaces having a roughness $R_{rms}$ in the range from about 0.43 nm to about 0.455 nm, when measured by AFM. In one embodiment, the enlarged trench includes exposed silicon surfaces having a roughness $R_{rms}$ in the range from about 0.13 nm to about 0.5 nm, when measured by AFM. In one embodiment, the enlarged trench includes exposed silicon surfaces having a roughness $R_{rms}$ in the range from about 0.14 nm to about 0.25 nm, when measured by AFM.

In one embodiment, the enlarged trench includes exposed silicon surfaces having a roughness $R_{max}$ in the range from about 1.4 nm to about 6 nm, when measured by AFM. In one embodiment, the enlarged trench includes exposed silicon surfaces having a roughness $R_{max}$ in the range from about 4.9 nm to about 6 nm, when measured by AFM. In one embodiment, the enlarged trench includes exposed silicon surfaces having a roughness $R_{max}$ in the range from about 1.5 nm to about 2.2 nm, when measured by AFM.

The improved smoothness of the surfaces resulting from the present invention may be expressed in other ways. Thus, in one embodiment, the enlarged trench obtained in accordance with the present invention includes sidewalls and other exposed silicon surfaces having a $R_{rms}$ roughness, measured by AFM, that is not significantly increased from the roughness of a similar, untreated, silicon surface. Thus, in one such embodiment, the silicon surface, post-etching has a $R_{rms}$ roughness, measured by AFM, within about 6% greater than that of a similar, untreated crystalline silicon surface. In another embodiment, the silicon surface, post-etching has a $R_{rms}$ roughness, measured by AFM, within about 10% greater than that of a similar, untreated crystalline silicon surface. In another embodiment, the silicon surface, post-etching has a $R_{rms}$ roughness, measured by AFM, within about 25% greater than that of a similar, untreated crystalline silicon surface. In another embodiment, the silicon surface, post-etching has a $R_{rms}$ roughness, measured by AFM, within about 90% greater than that of a similar, untreated crystalline silicon surface.

In one embodiment, the enlarged trench obtained in accordance with the present invention includes sidewalls and other exposed silicon surfaces having a roughness such that, when a strain inducing silicon alloy is deposited in the trench, the deposit contains a number of stacking faults or dislocations that is within about one order of magnitude of the number of stacking faults or dislocations that would be obtained by depositing the same strain inducing silicon alloy on a similar, untreated crystalline silicon surface. That is, for example, if a strain inducing SiGe alloy is deposited on an untreated crystalline silicon surface would result in about $10^8$ dislocations per square centimeter ($10^8/cm^2$), in one embodiment, the number of dislocations in a strain inducing SiGe alloy deposited on a surface etched in accordance with the present invention would be no more than about $10^7$ dislocations per square centimeter ($10^7/cm^2$). It is recognized that the actual number of dislocations/$cm^2$ may vary widely, depending on many factors, such as the ratio of Si to the alloying element, the conditions of deposition, any subsequent annealing, and other factors known to the skilled artisan. However, this feature may be readily determined by comparing strain inducing silicon alloys deposited under substantially identical conditions on the two different substrates, i.e., untreated and etched in accordance with the present invention.

As described in the foregoing, it is important for the surfaces etched by the process of the present invention to be as smooth as possible, to enhance the epitaxial deposition of the silicon alloy onto these surfaces. The smoothness (or, conversely, lack of roughness) attained by the present invention provides an important advance in the art. The ability of the present invention to attain the desired relatively smooth surfaces without additional smoothing steps, is important in helping to control the total number of steps in the semiconductor fabrication process.

In one embodiment, the enlarged trench comprises sidewalls having a roughness, as measured by AFM, that is substantially similar to the roughness of the unprocessed active silicon surface in the (100) plane. To be "substantially similar", the roughness of the etched silicon surface should be no more than about 100% rougher than the unprocessed active silicon surface in the (100) plane, based on the $R_{rms}$ roughness, as measured by AFM.

The following table illustrates comparative AFM $R_{rms}$ roughness values for unprocessed silicon and roughness measurements for silicon surfaces after treatment of the silicon surfaces in accordance with two embodiments of the present invention. In the table, "1" is 3% benzyltrimethyl ammonium hydroxide and 1.5% tetradecyltributyl phosphonium chloride, and "2" is 0.2% benzyltrimethyl ammonium hydroxide, 0.5% hexadecyltributyl phosphonium chloride and 0.5% dipropyleneglycol monobutyl ether.

| Sample | Description/Conditions | $R_a$, nm | $R_{rms}$, nm | $R_{max}$, nm |
|---|---|---|---|---|
| 1 | Unprocessed Si | 0.339 | 0.430 | 4.931 |
| 1 | 320 seconds @ 55° C. | 0.355 | 0.455 | 5.886 |
| 1 | 420 seconds @ 55° C. | 0.430 | 0.543 | 5.995 |
| 2 | Unprocessed Si | 0.105 | 0.134 | 1.468 |
| 2 | 300 seconds @ 55° C. | 0.201 | 0.253 | 2.230 |

As shown in the above table, the $R_{rms}$ roughness of the etched silicon surface in the 420 seconds application of sample 1 is (0.543−0.430)/0.430×100=26.3% rougher. The $R_{rms}$ roughness of the etched silicon surface in the 320 seconds application of sample 1 is (0.455−0.430)/0.430×100=5.8% rougher. The $R_{rms}$ roughness of the etched silicon surface in the 300 seconds application of sample 2 is (0.253−0.134)/0.134×100=88.8% rougher.

Drawings

Figure 2:
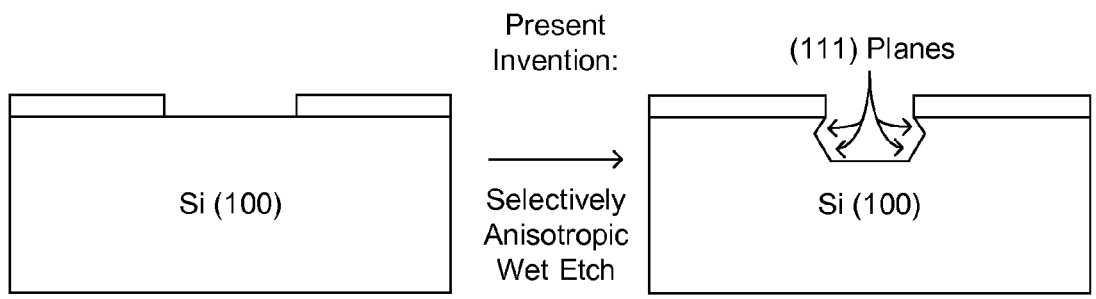
FIG. 2 is a schematic cross-sectional view depicting the selectively anisotropic wet etch in accordance with an embodiment of the present invention.

FIGS. 1-3 illustrate effects of application of processes in accordance with the present invention.

FIG. 1 is a schematic cross-sectional view of a portion of a nascent semiconductor device comparing a prior art etch process with an etch process in accordance with an embodiment of the present invention. As schematically illustrated in FIG. 1, when a typical, non-selective isotropic dry etch is applied, the resulting etching affects each of the (100), (110) and (111) planes of the silicon crystal structure substantially equally, resulting in an etched surface that is not aligned with any of the planes of the silicon crystal structure. Thus, if an attempt is made to deposit a stress-inducing material, the result if unsatisfactory.

In contrast, as depicted in FIG. 1, when a selectively anisotropic wet etch in accordance with the present invention is applied to the silicon substrate, the selective etching results in etching the (100) and (110) planes at about equal rates and preferentially to the (111) plane. This controlled selectivity in the selectively anisotropic wet etching results in an etched surface in which the silicon in the (111) planes remains, as depicted in FIG. 1, and in which the (111) surfaces are quite smooth. The bottom of the trench is generally in the (100) plane, as will be understood.

FIG. 2 is a schematic cross-sectional view depicting a selectively anisotropic wet etch in accordance with an embodiment of the present invention. As schematically illustrated in FIG. 2, when a monocrystalline silicon substrate, e.g., the Si (100) substrate, is etched in accordance with the present invention, in which the (100) and (110) planes are selectively etched at comparable, about equal, rates and preferentially to the (111) plane, the resulting silicon exhibits facets primarily in the (111) plane. As shown in FIG. 2, in this embodiment, the selectively anisotropic wet etching partially undercuts each of the plurality of structures and the enlarged trench comprises two sidewalls in the (111) plane. This is shown also in FIGS. 1, 3 and 5C. As indicated and described in more detail with respect to FIG. 5C, in this embodiment, both of the inner sidewalls have facets in the (111) plane.

FIG. 3 is a schematic cross-sectional view of a nascent transistor illustrating important aspects of embodiments of the present invention. FIG. 3 illustrates some critical dimensions in the transistor structures to which embodiments of the present invention are applicable. The nascent transistor in FIG. 3 is shown at a stage following application of a process in accordance with the present invention. Important or critical dimensions and/or features in the device are identified as items (a), (b), (c) and (d).

Item (a) in FIG. 3 indicates the neck dimension, which is the smallest or shortest path through the channel region between what will become the source and drain of the transistor. The neck results from the preferential etching of the (100) and (110) planes, relative to the (111) plane, in accordance with the present invention and, when the silicon alloy subsequently is deposited in the source and drain regions, results in a stronger compressive or tensile stress to be applied to the channel region. As a result of the stronger stress, hole or electron mobility (depending on the silicon alloy) can be increased to thereby improve the current driving capability of the transistor.

Item (b) in FIG. 3 indicates the trench depth, which is desirably controlled during the etch process in accordance with embodiments of the present invention, so that a controlled desirable depth is attained in the etch process. In the etching process in accordance with the present invention, the (100) and (110) planes are selectively etched, relative to the (111) plane. Thus, there is an increase in the trench depth (b), while the neck at (a) is being formed.

Item (c) in FIG. 3 refers generally to the sidewall and trench bottom roughness. In accordance with embodiments of the present invention, when the selectively anisotropic wet etching is carried out, exceptionally smooth surfaces are attained. It is not known with certainty exactly what factors contribute to the observed smoothness, but the surfaces etched in accordance with the present invention have been found to be considerably smoother and more even than surfaces etched by prior art selective etchants used for the same general purpose. Thus, item (c) illustrates an important and unexpected feature of processes in accordance with the present invention.

Item (d) in FIG. 3 illustrates that the gate oxides, nitrides and/or other materials in the gate structure, are not etched by the compositions used in accordance with the present invention. Thus, in embodiments of the present invention, the gate structure, including the gate oxides, nitrides and/or other materials, functions as a mask and/or to define the areas that will be etched in the process.

In one embodiment, the present invention further relates to a process for manufacturing an improved PMOS semiconductor transistor. Recesses are etched into a layer of epitaxial silicon. Source and drain films are deposited in the recesses. The source and drain films are made of an alloy of silicon, germanium, and boron incorporated during deposition. By incorporating boron during deposition, a higher active dopant concentration can be obtained than with implantation techniques. The alloy is epitaxially deposited on the layer of silicon. The alloy thus has a lattice having the same crystal structure as the crystal structure of the lattice of the layer of silicon. However, due to the inclusion of the germanium replacing some of the silicon atoms, the lattice of the alloy has a larger spacing than the spacing of the lattice of the layer of silicon. The larger spacing creates a stress in a channel of the transistor between the source and drain films. The stress, together with reduced resistivity due to the higher active dopant concentration, increases $I_{DSAT}$ and $I_{DLIN}$ of the transistor. An NMOS transistor can be manufactured in a similar manner by including carbon instead of germanium as the alloying atom, which thereby creates a tensile stress. The present invention will be described with respect to the formation of a PMOS transistor. One skilled in the art will appreciate that an NMOS transistor may be manufactured in a similar manner, except that doping conductivity types and lattice spacing will be reversed.

According to an embodiment of the present invention, because a silicon alloy layer, which may have a predetermined conductivity obtained by selected doping of the silicon alloy, is epitaxially grown adjacent to the channel region, a stress is induced in the channel region, and this improves greatly the mobility of carriers through the channel region.

For example, when the semiconductor device is a p-channel MOS transistor, the silicon alloy layer is formed from a SiGe alloy, and a compressive stress is applied from the SiGe alloy layer on the two sides of the channel region to the channel region along a moving direction of holes. In an embodiment in which the SiGe alloy layer has been formed in a Σ-shape (sigma-shape), the extended portion of the SiGe alloy layer, the extended portion of the SiGe mixed crystal layer generates a stress in the silicon crystal in the channel region. As a result, it is possible to effectively apply the compressive stress on the channel region, which increases the mobility of the carriers in the channel region.

On the other hand, when the semiconductor device is an n-channel MOS transistor, the silicon alloy layer is formed from a SiC alloy, and a stretching stress is induced on the channel region along the moving direction of electrons, which increases the mobility of electrons in the channel region.

FIGS. 4A, 4B and 4C illustrate schematically the foregoing effects. FIGS. 4A, 4B and 4C are schematic cross-section views of portions of a nascent transistor in a semiconductor device. As shown in FIG. 4A, the nascent transistor has undergone an anisotropic etching in the opening defined by the gate structure shown in FIG. 4A to form a first trench having generally flat surfaces (i.e., not resulting from selective etching of any particular planes in the silicon substrate). The nascent transistor shown in FIG. 4A next undergoes the selectively anisotropic wet etching of the silicon substrate in accordance with an embodiment of the present invention to form the device in FIG. 4B. Then, the nascent transistor shown in FIG. 4B is subjected to epitaxial deposition of a silicon alloy in the opening obtained by the selectively anisotropic wet etching to form structures such as a source and a drain in the nascent transistor shown in FIG. 4C. As described above, the epitaxial deposition of a silicon alloy results in stress in the channel region between the source and the drain, illustrated schematically by the dashed lines in the channel region in FIG. 4C.

FIGS. 5A, 5B, 5C and 5D illustrate schematically a process in accordance with an embodiment of the present invention. FIGS. 5A, 5B, 5C and 5D are cross-sectional schematic views of portions of a nascent semiconductor device 10 illustrating steps of a process of fabricating the semiconductor device 10, including processes for etching a silicon layer and for both etching a silicon layer and depositing a silicon alloy in the trench resulting from the etching, according to embodiments of the present invention.

Figure 5A:
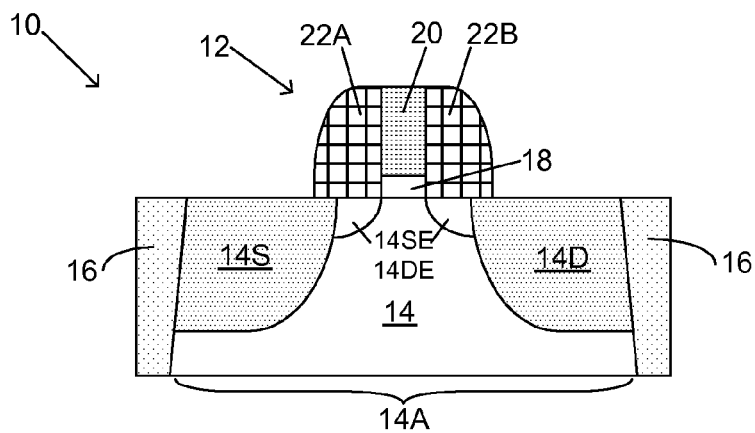
FIGS. 5A-5D are schematic cross-sectional views depicting a process of etching a silicon substrate to form openings and then depositing a silicon alloy in the openings, in accordance with another embodiment of the present invention.

FIG. 5A, schematically depicts elements of a gate structure 12 disposed on a single crystal silicon substrate 14 in the device 10. The single crystal silicon substrate 14 has a (100) crystal plane as a principal plane. The device 10 further includes a device region 14A, which is defined by the element isolation regions 16, which may be, for example, STI-type isolation structures. The device 10 includes a source region 14S and a drain region 14D. The gate structure 12 includes a gate insulating film 18 and a gate electrode 20, which may be formed by patterning a SiON film and a poly-silicon film, which have been uniformly formed on the silicon substrate 14, by various known processes. The gate structure 12 further includes sidewall insulating films 22A and 22B. The device 10 further includes a source extension region 14SE and a drain extension region 14DE. The source extension region 14SE and drain extension region 14DE are of p-type, and in contact with p-type diffusion regions 14S and 14D, respectively, which form a source region 14S and a drain region 14D of the device 10, respectively. The source extension region 14SE and the drain extension region 14DE have been formed, for example, by implanting boron or other p-type impurities, using the gate electrode 20 as a mask. Additional features may be added to the device 10 as is known in the art. For example, the gate structure 12 may comprise both first and second sidewall insulation structures (not shown); the device 10 may include features such as source and drain pocket regions, additional isolation layers, etc. (not shown).

Figure 5B:
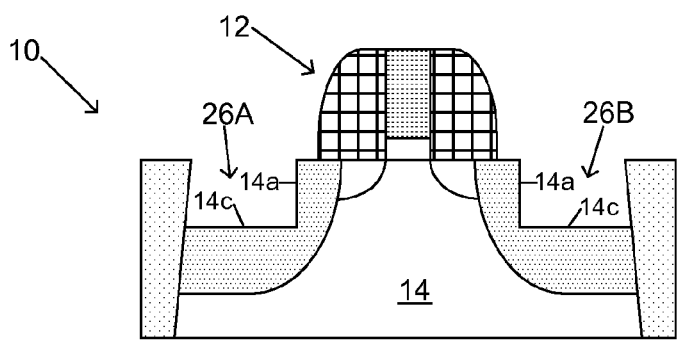

Next, in the step shown in FIG. 5B, in the silicon substrate 14, a portion of the source region 14S and the drain region 14D in the device region 14A, between the side-wall insulating films 22A and 22B and the element isolation regions 16, is anisotropically etched, e.g., by dry etching, to a depth of 10 to 60 nm, to form initial trenches 26A and 26B. The initial trenches 26A and 26B are defined by the side surface 14a, which is substantially perpendicular to the principal (100) plane of the silicon substrate 14, and the side surface 14c, which is substantially parallel to the principal (100) plane of the silicon substrate 14.

Figure 5C:
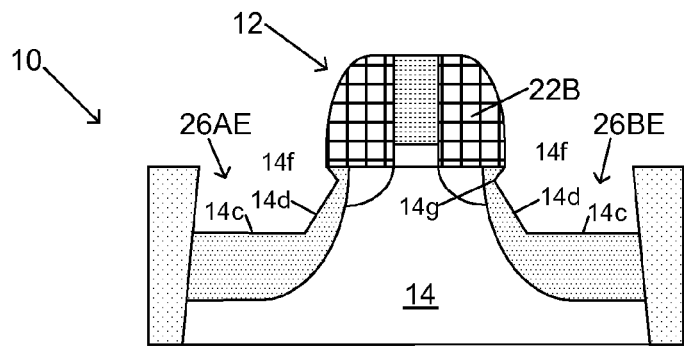

Next, in the step shown in FIG. 5C, a process in accordance with an embodiment of the present invention is applied, to selectively anisotropic etch silicon in the (100) and (110) planes, relative to the (111) plane, to form enlarged trenches 26AE and 26BE. In accordance with the present invention, the selective anisotropic etching etches the (110) and (100) planes at about equal rates and preferentially to the (111) plane. In accordance with an embodiment of the present invention, the silicon layer 14 having thereon a plurality of gate structures 12, which are disposed to create openings exposing the silicon layer, having anisotropically etched first, initial, trenches 26A, 26B, in the silicon layer through the openings, the next main step of the process includes a selectively anisotropic wet etching of the silicon surfaces in the first, initial, trenches 26A, 26B. In this embodiment, the selectively anisotropic wet etching includes exposing the silicon surfaces, e.g., the surfaces 14a and 14c, to an aqueous composition including an aromatic tri(lower)alkyl quaternary onium hydroxide, and an unsymmetrical tetraalkyl quaternary phosphonium salt, in accordance with the present invention. As a result, the selective wet etching etches (110) and (100) planes of the silicon layer 14 and at about equal rates that are higher than the etching rate than (i.e., preferentially to) the (111) plane to form an enlarged trench having sidewalls 14d and 14f in the (111) plane.

As shown in FIG. 5C, in the p-channel MOS transistor in the device 10, each of the enlarged trenches 26AE and 26BE in the silicon substrate 14 includes the bottom surface 14c, which is substantially parallel to the principal plane of the silicon substrate 14, the side surface 14d which is formed from the facet in the Si (111) plane at an angle of about 56° relative to the bottom surface 14c, and extends inwardly, and a side surface 14f formed from a facet in a Si (111) plane at an angle of about 124° relative to the bottom surface 14c. The side surface 14f extends inwardly from the surface of the silicon substrate 14, which is also the interface between the silicon substrate 14 and the sidewall insulating films 22A and 22B. The side surface 14d and the side surface 14f intersect at a point 14g, thereby forming a wedge shape facing inwardly, toward the channel region, as depicted in FIG. 5C.

In accordance with the invention, the selective etching obtained by the compositions disclosed herein provides rapid and controlled etching of the silicon, thereby enabling facile formation of the wedge shape depicted in FIG. 5C. While similar etching (although using very different etching chemistry) to obtain similar shapes has been done in the past, the known processes have been less successful and it has been more difficult to obtain the desired profile, while at the same time obtaining both the desired plane selectivity and the very smooth etched surfaces provided by the present invention.

In one embodiment, the present invention further includes epitaxially depositing a silicon alloy into at least a portion of the enlarged trenches 26AE and 26BE. In one embodiment, the silicon alloy is a silicon-germanium (SiGe) alloy, and in another embodiment, the silicon alloy is a silicon-carbon alloy (SiC). The silicon alloy can be doped appropriately, either by co-deposition of a dopant or by subsequent implantation of a dopant, as is known in the art and which is not further described herein for brevity. The wedge shape trench, when filled, provides a structure having a shape that may be referred to as a sigma shape.

Figure 5D:
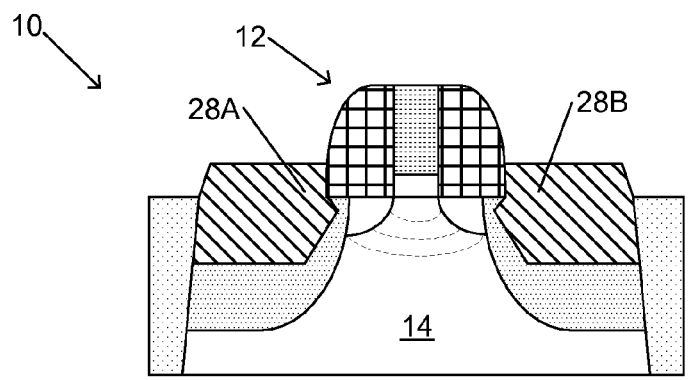

For example, in one embodiment, as illustrated in FIG. 5D, p-type SiGe mixed crystal layers 28A and 28B are grown epitaxially in the enlarged trenches 26AE and 26BE to fill the enlarged trenches 26AE and 26BE. As is known in the art and as briefly described above, due to the epitaxial growth and the different, larger, lattice parameter of the SiGe crystal as compared to the pure Si crystal, a compressive force is applied to the structures adjacent to the SiGe mixed crystal layers 28A and 28B. Similar to the depiction in FIG. 2, in FIG. 5D the strain resulting in the channel region is schematically depicted by the dashed lines in the channel region.

In the SiGe mixed crystal layers 28A and 28B, an inner point 14g of the wedge, which is the intersection line of the side surface 14d and the side surface 14f, is formed at an inside position relative to the outer surface of the second side wall insulating films 22A or 22B, and the SiGe mixed crystal layers 28A and 28B are near the channel region just below the gate electrode 20. Thus, the channel region between the SiGe mixed crystal layers 28A and 28B is smaller than that in the prior art in which the source and drain have more vertical walls aligned with the gate structure 12. The smaller channel region, together with the stress resulting from the epitaxially grown silicon alloy, enhances mobility of charges moving from source to drain, whether the channel region is N-type or P-type (with the appropriate silicon alloy).

Due to the wedge shape of the enlarged trench 26A and 26B, and to the Σ-shape of the SiGe mixed crystal layers 28A and 28B, a stronger compressive stress can be induced in the channel region than those in prior art p-channel MOS transistors having a standard sidewall profile. Thus, it is possible to increase the hole mobility and improve the current driving capability of the p-channel MOS transistor in the device 10.

In an embodiment having opposite doping and in which the silicon alloy epitaxially applied to fill the wedge shape enlarged trench 26A and 26B is SiC, a tensile stress results. As is known in the art and as briefly described above, due to the epitaxial growth and the different, smaller, lattice parameter of the SiC crystal as compared to the pure Si crystal, a tensile stress is applied to the structures adjacent to the SiC mixed crystal layers 28A and 28B, when SiC is the silicon alloy. The tensile stress results in increased electron mobility, which improves the current driving capability of corresponding n-channel MOS transistors.

Following the process steps outlined above with respect to FIGS. 5A-5D, the semiconductor device 10 may be further processed in accordance with usual procedures known in the art.

It is noted that, throughout the specification and claims, the numerical limits of the disclosed ranges and ratios may be combined, and are deemed to include all intervening values. Thus, for example, where ranges of 1-100 and 10-50 are specifically disclosed, ranges of 1-10, 1-50, 10-100 and 50-100 are deemed to be within the scope of the disclosure, as are the intervening integral values. Furthermore, all numerical values are deemed to be preceded by the modifier "about", whether or not this term is specifically stated. Finally, all possible combinations of disclosed elements and components are deemed to be within the scope of the disclosure, whether or not specifically mentioned, since it is not possible to enumerate every possible combination and/or permutation of ingredients. Thus, it is considered and the skilled person will recognize that each and every combination and permutation of the disclosed members of each element of the disclosed invention is within the scope of the disclosure in accordance with, e.g., EPC 123(2).

While the principles of the invention have been explained in relation to certain particular embodiments, and are provided for purposes of illustration, it is to be understood that various modifications thereof will become apparent to those skilled in the art upon reading the specification. Therefore, it is to be understood that the invention disclosed herein is intended to cover such modifications as fall within the scope of the appended claims. The scope of the invention is limited only by the scope of the claims.

The invention claimed is:

1. A process for etching a silicon layer disposed on a substrate, comprising:
    anisotropically etching a first trench in the silicon layer;
    selectively anisotropic wet etching silicon surfaces in the first trench, the wet etching comprising exposing the silicon surfaces to an aqueous composition comprising:
    an aromatic-containing quaternary onium hydroxide, and
    an unsymmetrical tetraalkyl quaternary phosphonium salt;
    wherein the wet etching etches (110) and (100) planes of the silicon layer at about equal rates and preferentially to (111) plane to form an enlarged trench having a sidewall in the (111) plane.

2. The process of claim 1 wherein the silicon layer has thereon a plurality of structures disposed to create openings exposing the silicon layer, and the anisotropically etching is carried out through the openings.

3. The process of claim 2 wherein the selectively anisotropic wet etching partially undercuts each of the plurality of structures and the enlarged trench comprises two sidewalls in the (111) plane.

4. The process of claim 1 wherein the aromatic-containing quaternary onium hydroxide comprises an ammonium or a phosphonium or a combination of any two or more thereof.

5. The process of claim 1 wherein the aromatic-containing quaternary onium hydroxide comprises, in addition to the aromatic group, three groups independently contain from 1 to about 4 carbon atoms.

6. The process of claim 1 wherein the aromatic-containing quaternary onium hydroxide is an aromatic tri(lower)alkyl quaternary onium hydroxide, in which the aromatic group is a benzyl or a phenyl group, and each lower alkyl is independently methyl or ethyl.

7. The process of claim 1 wherein the unsymmetrical tetraalkyl quaternary phosphonium salt comprises an alkyl group having from about eight to about 18 carbon atoms and further comprises one or more lower alkyl groups independently containing from 1 to about 4 carbon atoms.

8. The process of claim 1 wherein the quaternary onium hydroxide is present at a concentration in the range from about 0.1 wt. % to about 20 wt. %, and the quaternary phosphonium salt is present at a concentration in the range from about 0.1 wt. % to about 20 wt. %.

9. The process of claim 1 wherein the aqueous composition further comprises a glycol, an alcohol, a glycol ether or a combination of any two or more thereof.

10. The process of claim 9 wherein the glycol, alcohol, and/or glycol ether is present at a concentration up to about 5 wt. %.

11. The process of claim 1 wherein the enlarged trench comprises exposed silicon surfaces having a roughness $R_a$ in the range from about 0.340 nm to about 0.450 nm, when measured by atomic force microscopy (AFM).

12. The process of claim 1 wherein the anisotropic etching is a dry etching.

13. A process for introducing stress into a silicon layer, comprising:
    providing a silicon layer disposed on a substrate, the silicon layer having a plurality of spacer features disposed thereon so as to create openings to the silicon layer;
    through the openings anisotropically etching a first trench in the silicon layer;
    selectively anisotropic wet etching silicon surfaces in the first trench, the wet etching comprising exposing the silicon surfaces to an aqueous composition comprising:
    an aromatic tri(lower)alkyl quaternary onium hydroxide, and
    an unsymmetrical tetraalkyl quaternary phosphonium salt;
    wherein the wet etching etches (110) and (100) planes of the silicon layer at about equal rates and preferentially to (111) plane to form an enlarged trench having sidewalls in the (111) plane; and
    epitaxially depositing a silicon alloy onto a silicon surface in at least a portion of the enlarged trench.

14. The process of claim 13 wherein the silicon alloy introduces stress into at least a portion of the silicon layer.

15. The process of claim 13 wherein the silicon alloy comprises silicon-germanium or silicon-carbon.

16. The process of claim 13 wherein the selectively anisotropic wet etching partially undercuts each of the plurality of spacer features and the enlarged trench comprises two sidewalls in the (111) plane.

17. The process of claim 13 wherein the aromatic tri(lower)alkyl quaternary onium hydroxide comprises an ammonium or a phosphonium or a combination of any two or more thereof.

18. The process of claim 13 wherein the aromatic tri(lower)alkyl quaternary onium hydroxide comprises, in addition to the aromatic group, three groups independently contain from 1 to about 4 carbon atoms.

19. The process of claim 13 wherein in the aromatic tri(lower)alkyl quaternary onium hydroxide, the aromatic group is a benzyl or a phenyl group, and each lower alkyl is independently methyl or ethyl.

20. The process of claim 13 wherein the unsymmetrical tetraalkyl quaternary phosphonium salt comprises an alkyl group having from about eight to about 18 carbon atoms and further comprises one or more lower alkyl groups independently containing from 1 to about 4 carbon atoms.

21. The process of claim 13 wherein the quaternary onium hydroxide is present at a concentration in the range from about 0.1 wt. % to about 20 wt. %, and the quaternary phosphonium salt is present at a concentration in the range from about 0.1 wt. % to about 20 wt. %.

22. The process of claim 13 wherein the aqueous composition further comprises a glycol, an alcohol, a glycol ether or a combination of any two or more thereof.

23. The process of claim 22 wherein the glycol, alcohol, and/or glycol ether is present at a concentration up to about 5 wt. %.

24. The process of claim 13 wherein the enlarged trench comprises exposed silicon surfaces having a roughness $R_a$ in the range from about 0.340 nm to about 0.450 nm, when measured by atomic force microscopy (AFM).

25. The process of claim 13 wherein the anisotropic etching is a dry etching.

* * * * *